(12) United States Patent
Yamamoto

(10) Patent No.: US 6,720,819 B1
(45) Date of Patent: Apr. 13, 2004

(54) DRIVER CIRCUIT FOR SEMICONDUCTOR SWITCHING DEVICE

(75) Inventor: Akihisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/426,879

(22) Filed: May 1, 2003

(30) Foreign Application Priority Data

Jan. 8, 2003 (JP) ........................................ 2003-002114

(51) Int. Cl.[7] .............................................. H03K 17/687
(52) U.S. Cl. ........................ 327/427; 327/434; 327/435
(58) Field of Search .................................. 327/108, 110, 327/112, 427, 430, 431, 434, 435, 436, 437, 538, 543, 483

(56) References Cited

U.S. PATENT DOCUMENTS

| | | | |
|---|---|---|---|
| 4,989,127 A | 1/1991 | Wegener | 363/16 |
| 5,625,312 A | 4/1997 | Kawakami et al. | 327/483 |
| 5,663,667 A * | 9/1997 | Blum et al. | 327/134 |
| 5,719,521 A * | 2/1998 | Wong | 327/434 |
| 6,057,728 A * | 5/2000 | Igarashi | 327/546 |
| 6,466,060 B2 * | 10/2002 | Lee | 327/108 |

FOREIGN PATENT DOCUMENTS

| | | |
|---|---|---|
| JP | 3-3415 | 1/1991 |
| JP | 8-18423 | 1/1996 |
| JP | 9-298870 | 11/1997 |

\* cited by examiner

*Primary Examiner*—Tuan T. Lam
(74) *Attorney, Agent, or Firm*—Oblon, Spivak, McClelland, Maier & Neustadt, P.C.

(57) ABSTRACT

A gate sink circuit includes a comparator for monitoring a gate voltage of a switching device in comparison with a predetermined threshold value; a sink switching device connected between the gate of the switching device and a ground line; an inverter for inverting an output of the comparator; another inverter for inverting an input signal for the switching device; an AND circuit for operating the logic product of each output from the inverters; and an RS flip-flop FF provided with the output of the AND circuit as a set signal and the input signal as a reset signal, thereby securely keeping an off-state of the switching device and greatly reducing flow-through current in turn-on.

2 Claims, 4 Drawing Sheets

DRIVER CIRCUIT FOR SEMICONDUCTOR SWITCHING DEVICE

BACKGROUND OF THE INVENTION

1. Field of the Invention

The present invention relates to a driver circuit for semiconductor switching device such as IGBT (Insulated Gate Bipolar Transistor) and MOSFET (Metal Oxide Semiconductor Field Effect Transistor).

2. Description of the Related Art

FIGS. 3A to 3C are circuit diagrams schematically showing the operation of conventional semiconductor switching devices. Switching devices Qa and Qb are connected in series between a power line (e.g., 300 V) of a power supply PS and a ground line (e.g., 0 V) in the totem pole configuration, where an output voltage Vout supplied to a load varies by alternately switching devices Qa and Qb. More specifically, when the source switching device Qa on the side of the power line turns on while the sink switching device Qb on the side of the ground line turns off, the output voltage Vout rises up to a voltage near the power-supply voltage of 300 V. On the other hand, when the switching device Qa turns off while the switching device Qb turns on, the output voltage Vout falls down to a voltage near the ground voltage of 0 V.

In case the switching devices Qa and Qb are configured of a voltage-driving type of semiconductor switching device such as IGBT and MOSFET, the capacitance C1 between the gate and the collector and the capacitance C2 between the gate and the emitter become relatively large. Such an influence must be reckoned with.

First, referring to FIG. 3A, when the gate voltage VGa of the switching device Qa is 0 V and the switching device Qa turns off while the gate voltage VGb of the switching device Qb is 15 V and the switching device Qb turns on, the capacitance C1 of the switching device Qa is charged at about 300 V voltages.

In FIG. 3B, when the gate voltage VGa is 315 V and the switching device Qa turns on while the gate voltage VGb is 0 V and the switching device Qb turns off, electric charge stored in the capacitance C1 of the switching device Qa passes through the switching device Qa, thereafter to be stored in the capacitance C1 of the switching device Qb. The charging current Ia is expressed by $C1 \times (dv/dt)$, and the electric charge $Q (=C1 \times V)$ is stored in the capacitance C1 of the switching device Qb.

In this case, since the parasitic resistance R exists in the gate of the switching device Qb, the gate voltage VGb rises up by the charging current Ia. The voltage rise-up $\Delta VGb$ is expressed by the following equation:

$$R \times Ia = R \times C1 \times (dv/dt)$$

In FIG. 3C, when the gate voltage VGa is 300 V and the switching device Qa turns off while the gate voltage VGb is 15 V and the switching device Qb turns on, the electric charge stored in the capacitance C1 of the witching device Qb passes through the switching device Qb, thereafter to flow down to the ground line. On the other hand, the capacitance C1 of the switching device Qa is charged at about 300 V voltages. In this case, since the parasitic resistance R (i.e., interconnect parasitic resistance and on-resistance of MOSFET in a gate sink circuit) also exists in the gate of the switching device Qa, the gate voltage VGa rises up by the charging current flowing into the capacitance C1.

In general, the pre-stage of the switching devices Qa and Qb is provided with a gate driver circuit for driving each of their gates. When a sink transistor of the gate driver circuit comprises an emitter follower circuit (common collector), the gate voltage of the sink transistor rises up in accordance with the voltage rise-up $\Delta VGb$. In FIG. 3B, the gate voltage VGb of the switching device Qb does not fully fall down to 0 V and a so-called tail voltage is generated. A gate sink circuit is generally provided to prevent the above gate voltage rise-up.

FIG. 4A is a circuit diagram showing an example of a conventional gate sink circuit, and FIG. 4B is a timing diagram showing the operation thereof. A gate driver circuit B1 includes a source-side transistor Q1 such as a p-type MOSFET and a sink-side transistor Q2 such as an n-type MOSFET, which are complementarily connected in series to drive the gate of a switching device Q3. An inverter G1 inverts an input signal supplied to an input terminal Tin to supply the inverted signal to the gate driver circuit B1.

The operation of the gate driver circuit B1 will be described. When the input voltage vin is at high level, the transistor Q1 of the gate driver circuit B1 turns on while the transistor Q2 turns off, so that the gate voltage VG of the switching device Q3 becomes high level, as a result the switching device Q3 turns on.

Next, when the input voltage Vin becomes low level, the transistor Q1 turns off while the transistor Q2 turns on, so that the gate voltage VG also becomes low level, as a result the switching device Q3 turns off.

Thus the switching device Q3 can make conduction or cut off alternatively in response to the input signal level.

A gate sink circuit B2 includes a comparator CMP, a sink switching device Qs such as an n-type MOSFET and an inverter G2. The comparator CMP monitors the gate voltage VG of the switching device Q3 and compares the gate voltage with a predetermined threshold voltage Vth. The sink switching device Qs is connected between the gate of the switching device Q3 and the ground line. The inverter G2 inverts an output of the comparator CMP to drive the sink switching device Qs. The threshold voltage Vth for the comparator CMP is set by the expression, power supply voltage Vcc×(division ratio of resistors R3 and R4).

The operation of the gate sink circuit B2 will be described below. Referring to FIG. 4B, when the input voltage Vin is at high level, the gate voltage VG is higher than the threshold voltage Vth of the comparator CMP. Thus, the output of the comparator CMP is high level while the output of the inverter G2 is low level, therefore the sink switching device Qs turns off.

When the input voltage Vin changes from high level to low level at the time t1, the switching device Q3 turns off, which corresponds to the transition state from FIG. 3A to FIG. 3B. Whereupon, the charging current flows to the capacitance between the gate and collector of the switching device Q3 and the tail voltage is generated in the gate voltage VG. The charging current decreases thereafter, when the gate voltage VG becomes lower than the threshold voltage Vth of the comparator CMP at the time t2, the output of the comparator CMP inverts into low level. As a result, the output of the inverter G2 becomes high level and the sink switching device Qs turns on. The gate of the switching device Q3 is conducted to the ground line, so that the gate voltage VG can be stabilized at the ground voltage.

Next, when the input voltage Vin changes from low level to high level at the time t5, the switching device Q3 turns on, which corresponds to the transition state from FIG. 3B to FIG. 3C. Whereupon, a discharge current flows from the capacitance between the gate and collector of the switching device Q3 and the gate voltage VG gradually rises up. When the discharge current decreases and the gate voltage VG becomes higher than the threshold voltage Vth of the comparator CMP at the time t6, the output of the comparator CMP inverts to high level. Thus, the output of the inverter G2 becomes low level and the sink switching device Qs turns off. The gate of the switching device Q3 is cut off from the ground line.

The following reference documents related to the prior art are given: Japanese Patent Unexamined Publication JPA-03-3415(1991), p.6, FIG. 1; JPA-08-18423(1996), FIG. 1; JPA-09-298870(1997), FIG. 1; JPA-2000-197343(2000), FIG. 1.

In the case the on-resistance of the sink switching device Qs is relatively large, variations of the gate voltage VG can not be sufficiently suppressed when the charging current flowing into the capacitance between the gate and collector of the switching device Q3 becomes large at the time t2 in FIG. 4B.

In addition, at the time t3 to t4 in FIG. 4B, when the gate voltage of a source-side switching device coupled with the switching device Q3 rises up, which influences also the gate voltage VG to increase. If the gate voltage VG at that time exceeds the threshold voltage Vth of the comparator CMP, the sink switching device Qs turns off and the gate sink circuit B2 has no operation.

As described above, a switching device having a large capacity and small on-resistance is needed as the sink switching device Qs in order to securely bypass the current flowing into the gate of the switching device Q3 to the ground line.

Moreover, at the time t5 to t6 in FIG. 4B, the transistor Q1 in the gate driver circuit B1 tunes on and the sink switching device Qs also turns on. Therefore, large flow-through current passes through both the transistor Q1 and the sink switching device Qs, resulting in reduction of power efficiency.

Incidentally, the driver circuit for semiconductor switching devices described in related prior art (e.g., the above reference documents) has a different gate sink circuit in configuration.

SUMMARY OF THE INVENTION

An object of the present invention is to provide a driver circuit for semiconductor switching device, which can securely keep an off-state of a semiconductor switching device, and can greatly reduce flow-through current in turn-on.

According to one aspect of the present invention, there is provided a driver circuit for semiconductor switching device, comprising:

a gate driver circuit for driving the gate of a semiconductor switching device in response to an input signal;

a comparator circuit for comparing a gate voltage of the semiconductor switching device with a predetermined threshold value;

a memory circuit capable of being set in response to inversion of an output of the comparator circuit and reset in response to inversion of the input signal; and a gate sink device for stabilizing the gate voltage of the semiconductor switching device when the memory circuit is set.

According to another aspect of the present invention, there is provided a driver circuit for semiconductor switching device, comprising:

a gate driver circuit for driving the gate of a semiconductor switching device in response to an input signal;

a filter circuit for delaying the input signal;

a comparator circuit for comparing an output of the filter circuit with a predetermined threshold value; and a gate sink device for stabilizing the gate voltage of the semiconductor switching device in accordance with the output of the comparator circuit.

According to the present invention, the off-state of the semiconductor switching device can be securely kept and flow-through current in turn-on can be greatly reduced, thereby improving power efficiency.

DETAILED DESCRIPTION OF THE PREFERRED EMBODIMENTS

Embodiment 1

Figure 1A:
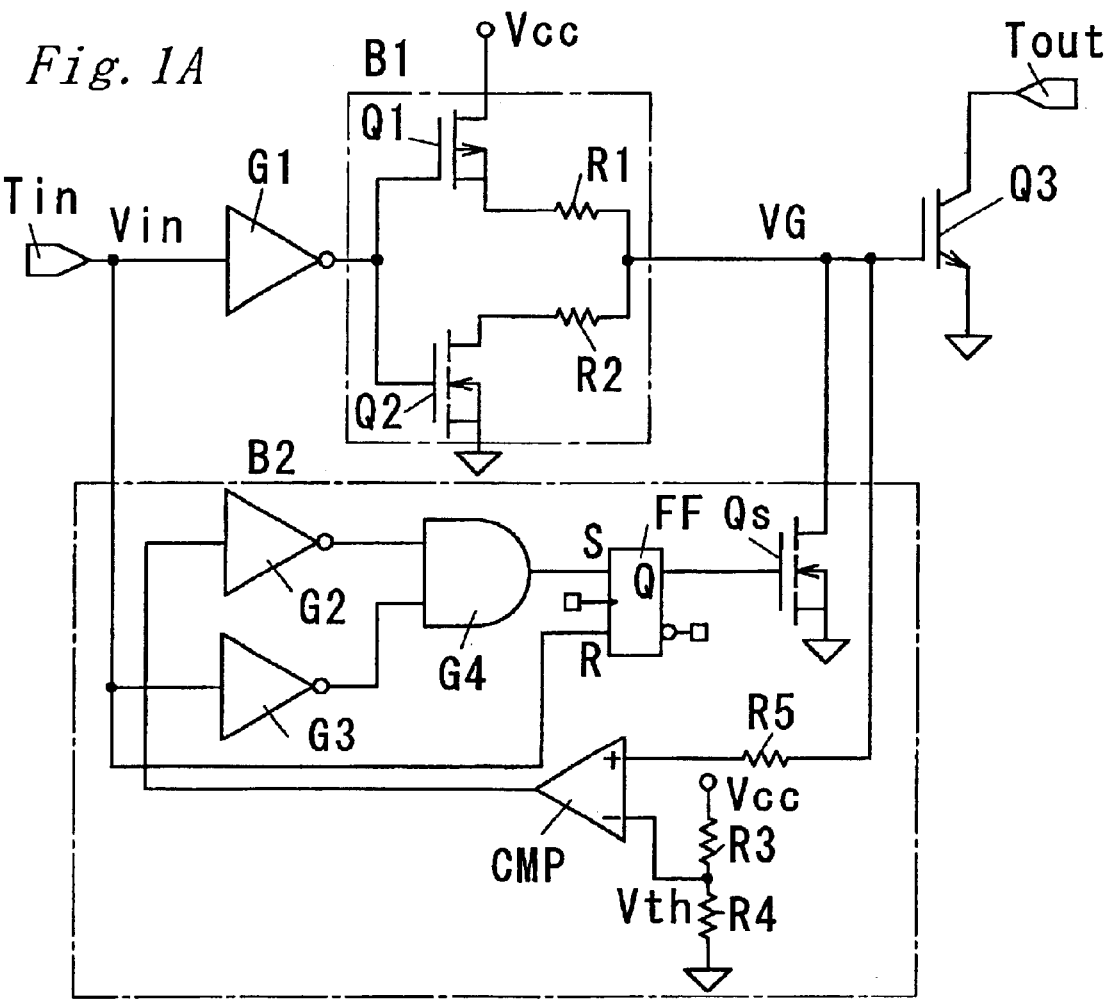
FIG. 1A is a circuit diagram showing one embodiment of the present invention.
Figure 1B:
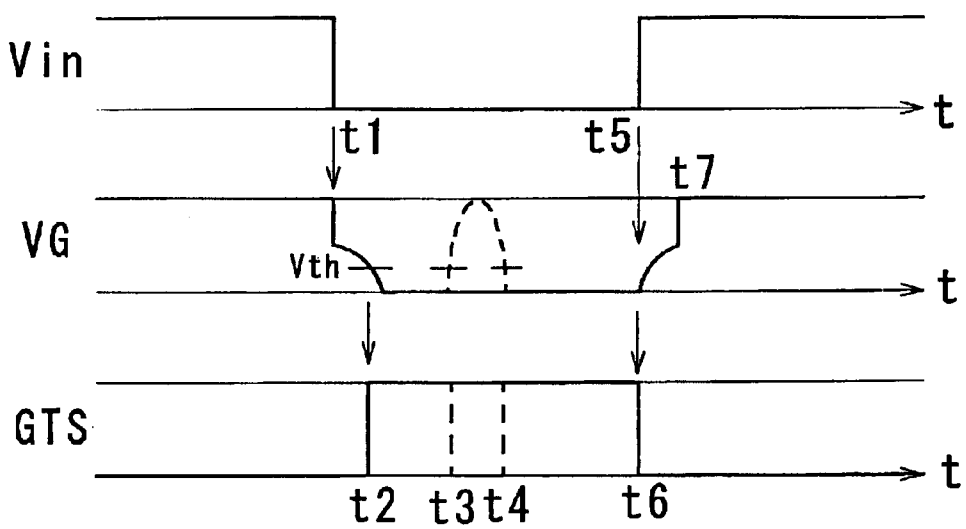
FIG. 1B is a timing diagram showing the operation.

FIG. 1A is a circuit diagram showing one embodiment of the present invention, and FIG. 1B is a timing diagram showing the operation thereof. A gate driver circuit B1 includes a source-side transistor Q1 such as p-type MOSFET and a sink-side transistor Q2 such as n-type MOSFET, which are complementarily connected in series to drive the gate of a switching device Q3. An inverter G1 inverts an input signal supplied to an input terminal Tin to supply the inverted signal to the gate driver circuit B1.

The operation of the gate driver circuit B1 will be described below. When the input voltage Vin is at high level, the transistor Q1 of the gate driver circuit B1 turns on while the transistor Q2 turns off, so that the gate voltage VG of the switching device Q3 becomes high level, as a result a switching device Q3 turns on.

Next, when the input voltage Vin becomes low level, the transistor Q1 turns off while the transistor Q2 turns on, so that the gate voltage VG becomes low level, as a result the switching device Q3 turns off.

Thus the switching device Q3 can make conduction or cut off alternatively in response to the input signal level.

A gate sink (GTS) circuit B2 includes a comparator CMP, a sink switching device Qs such as n-type MOSFET, an inverter G2, an inverter G3, an AND circuit G4, and an RS flip-flop FF. The comparator CMP monitors the gate voltage VG of the switching device Q3 and compares the gate voltage with a predetermined threshold value Vth. The sink switching device Qs is connected between the gate of the switching device Q3 and a ground line. The inverter G2 inverts an output of the comparator CMP while the inverter G3 inverts the input signal from the terminal Tin. The AND circuit G4 operates the logic product of each output from the inverters G2 and G3. The RS flip-flop FF is provided with the output of the AND circuit G4 as a set signal and the input signal from the terminal Tin as a reset signal.

The gate of the sink switching device Qs is supplied with an output signal Q of the RS flip-flop FF. The threshold voltage Vth for the comparator CMP is set by the expression, power supply voltage Vcc×(division ratio of resistors R3 and R4).

The operation of the gate sink circuit B2 will be described below. Referring to FIG. 1B, when the input voltage Vin is at high level, the gate voltage VG is higher than the threshold voltage Vth of the comparator CMP. Thus, the output of the comparator CMP becomes high level, and the output of the inverter G2 becomes low level while the output of the AND circuit G4 also becomes low level. On the other hand, the reset signal of the RS flip flop FF becomes high level while the output signal Q thereof becoming low level, therefore the sink switching device Qs turns off.

Next, at the time t1, when the input voltage Vin changes from high level to low level, the output of the inverter G3 becomes high level and the reset signal of the RS flip flop FF becomes low level. At that time, the gate voltage VG also changes to low level and the switching device Q3 turns off. Charging current flows to the capacitance between the gate and collector of the switching device Q3 and tail voltage is generated in the gate voltage VG. Thereafter the charging current decreases. When the gate voltage VG becomes lower than the threshold voltage Vth of the comparator CMP at the time t2, the output of the comparator CMP inverts to low level and the output of the inverter G2 becomes high level. Whereupon, the output of the AND circuit G4 becomes high level, and the set signal of the RS flip flop FF changes upto high level and the output signal Q becomes high level, therefore, the sink switching device Qs turns on. Then the gate of the switching device Q3 makes conduction with the ground line, so that the gate voltage VG can be stabilized at the ground voltage.

Next, at the time t3 to t4, in case the gate voltage of a source-side switching device (not shown) coupled with the switching device Q3 increases, which influences the gate voltage VG to increase (see broken line shown in FIG. 1B). If the gate voltage VG exceeds the threshold voltage Vth of the comparator CMP, the output of the comparator CMP becomes high level and the output of the inverter G2 becomes low level, then the AND circuit G4 becomes low level and the set signal of the RS flip flop FF becomes low level. In this embodiment, since the output signal Q of the RS flip flop FF is kept at high level, the on-state of the sink switching device Qs continues, so that the gate voltage VG can be stabilized at the ground voltage.

Accordingly, while the input signal is at low level, the on-state of the sink switching device Qs can continue regardless of variations in the output of the comparator CMP.

At the time t5, when the input voltage Vin changes from low level to high level, the output of the inverter G3 becomes low level and the set signal of the RS flip flop FF is inverted to low level while the reset signal being inverted to high level. Whereupon, the output signal Q changes to low level and the sink switching device Qs turns off, therefore, the gate of the switching device Q3 is cut off from the ground line.

At the time t7, the gate voltage VG changes to high level by the gate driver circuit B1, so that the switching device Q3 can turn on.

Accordingly, when the input signal changes from low level to high level, the sink switching device Qs directly turns off by the logic circuit, which can shorten the period when both the transistor Q1 in the gate driver circuit B1 and the sink switching device Qs in the gate sink circuit B2 simultaneously turn on. As a result, flow-through current can be reduced, resulting in improvement of power efficiency.

Furthermore, the gate sink circuit B2 is preferably provided with the AND circuit G4 which can operate the logical product of the low level of the input signal from the terminal Tin and the low level of the output of the comparator CMP, thus whereby, while the input signal is at low level, the set signal of the RS flip flop FF can be securely kept at low level regardless of variations in the output of the comparator CMP.

In this embodiment, the RS flip flop FF is used for the memory circuit. Alternately, another type flip flop and bi-stable circuit may be used. In addition, the AND circuit is used here for the logical product circuit. Alternately, other type of gate circuits may be used. Incidentally, the logical form (i.e. high-active or low-active) of the logic circuit can be properly modified in accordance with the logical form of the input signal.

Embodiment 2

Figure 2A:
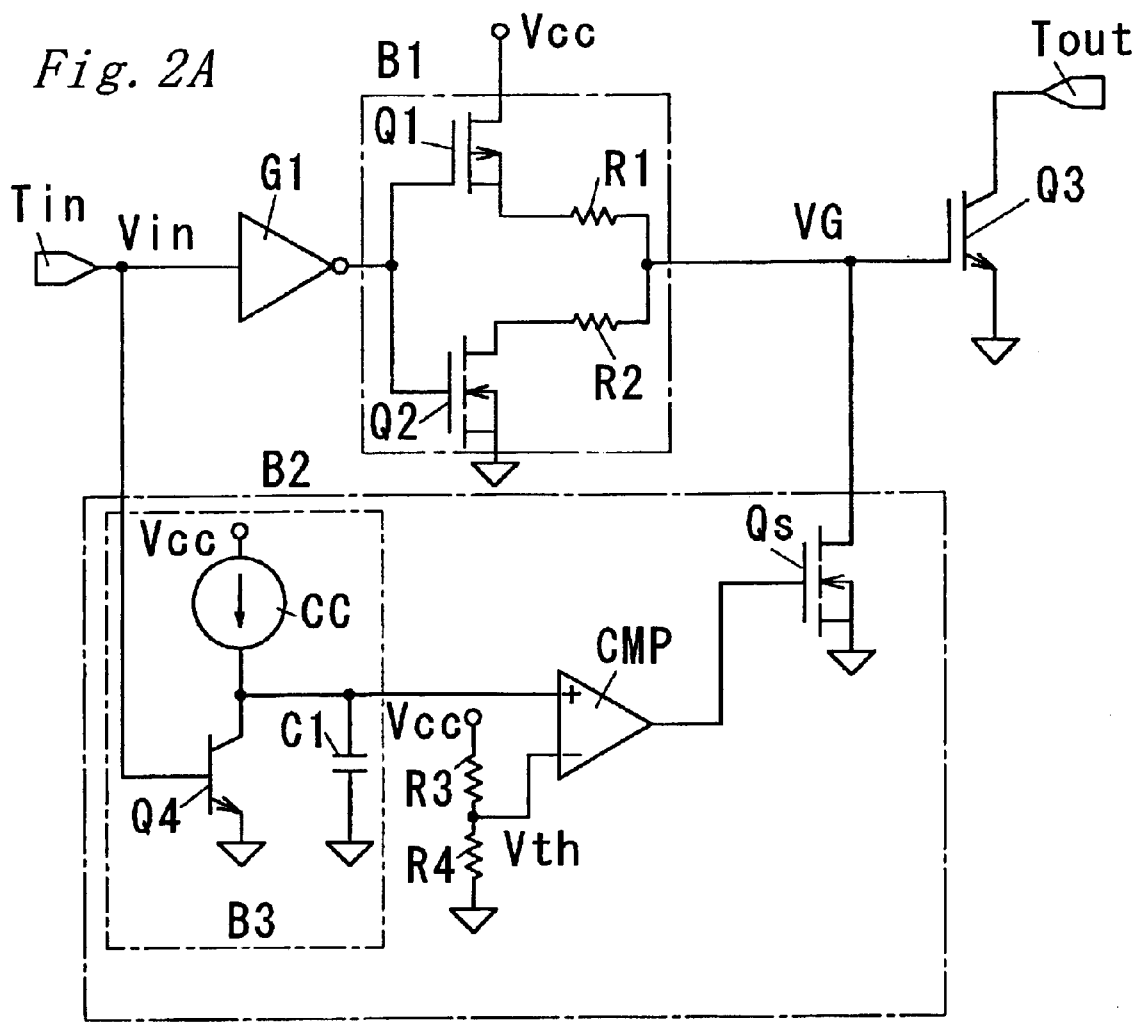
FIG. 2A is a circuit diagram showing another embodiment of the present invention.
Figure 2B:
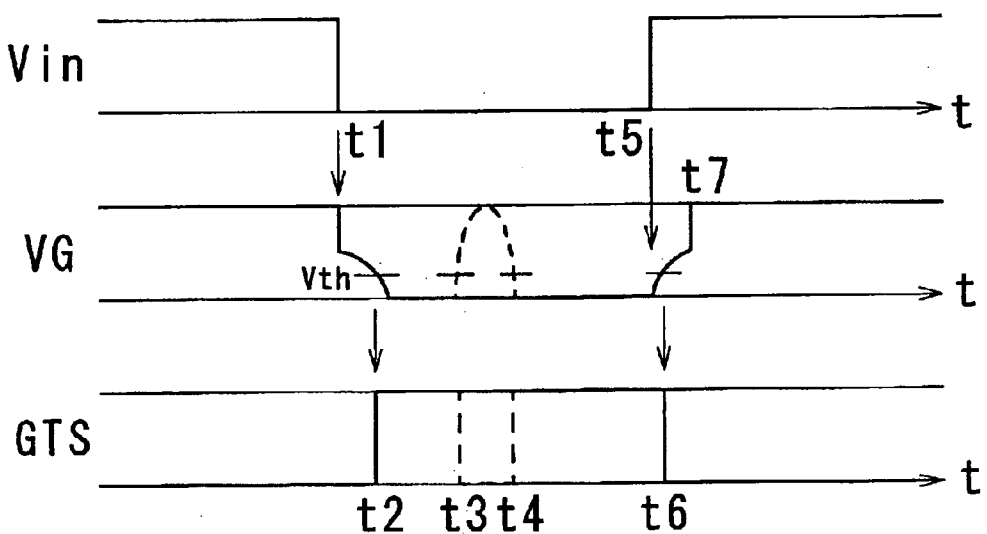
FIG. 2B is a timing diagram showing the operation.
Figure 3A:
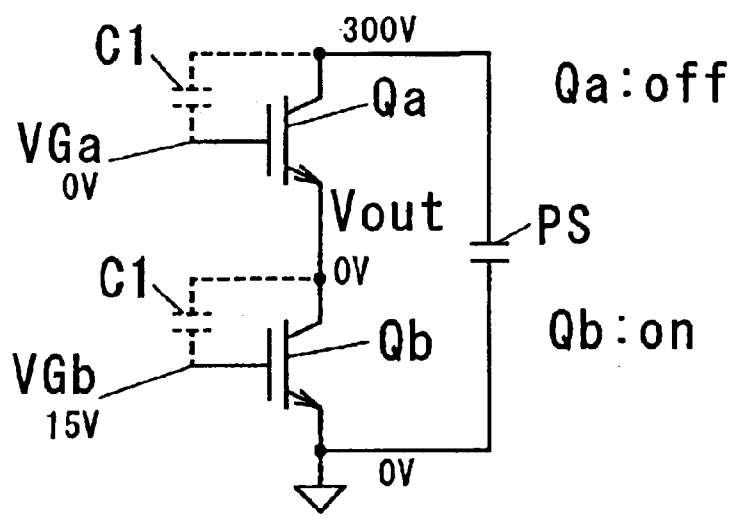
FIG. 3 is a circuit diagram schematically showing the operation of a conventional semiconductor switching device.
Figure 3B:
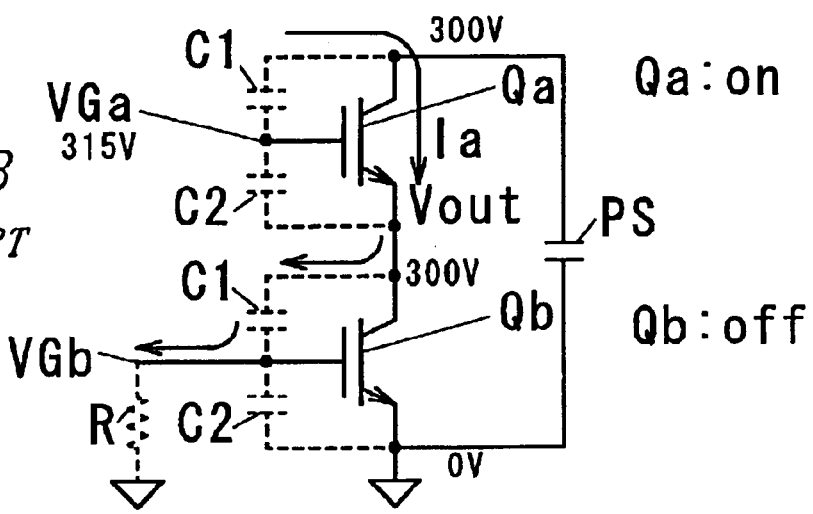
Figure 3C:
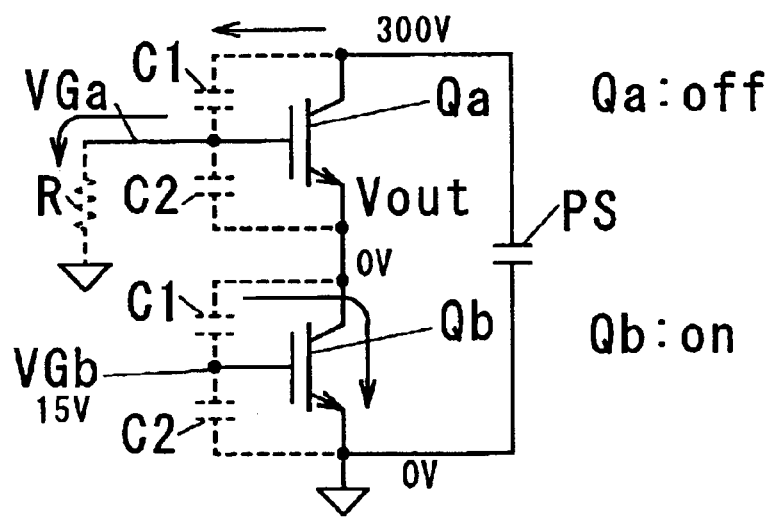
Figure 4A:
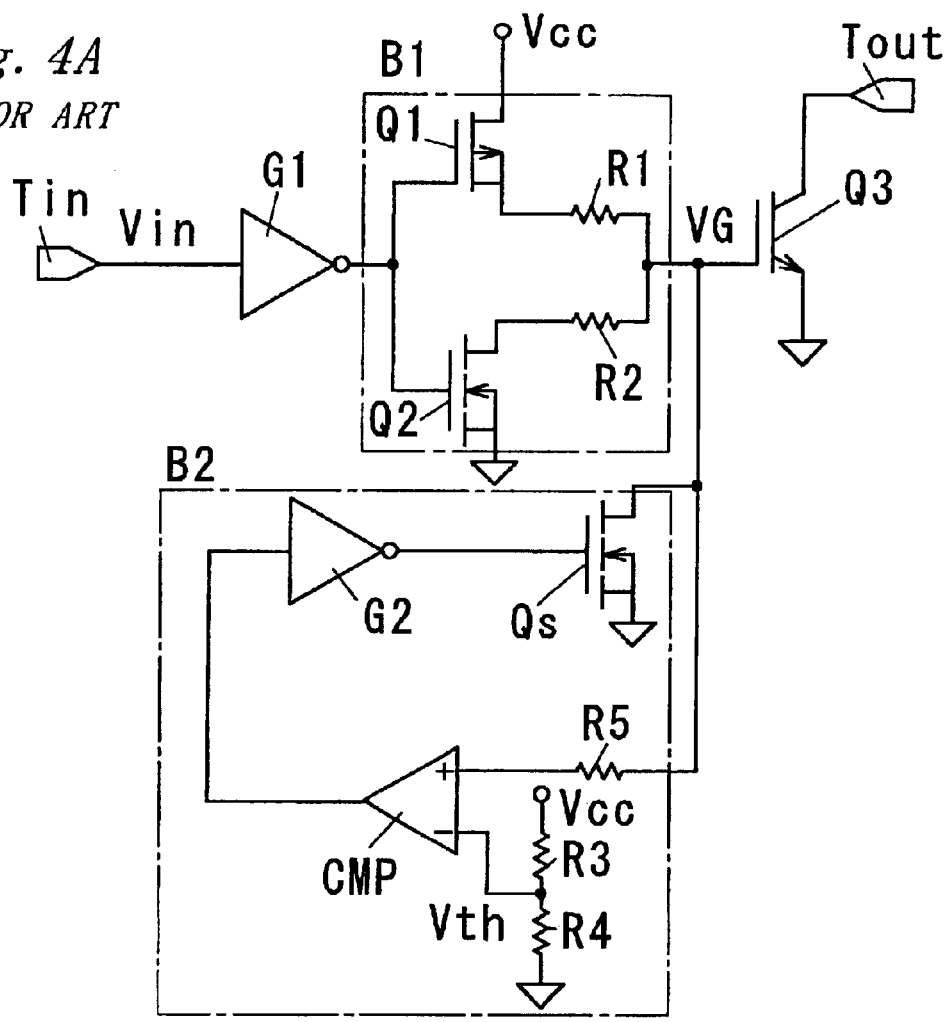
FIG. 4A is a circuit diagram showing an example of a conventional gate sink circuit.
Figure 4B:
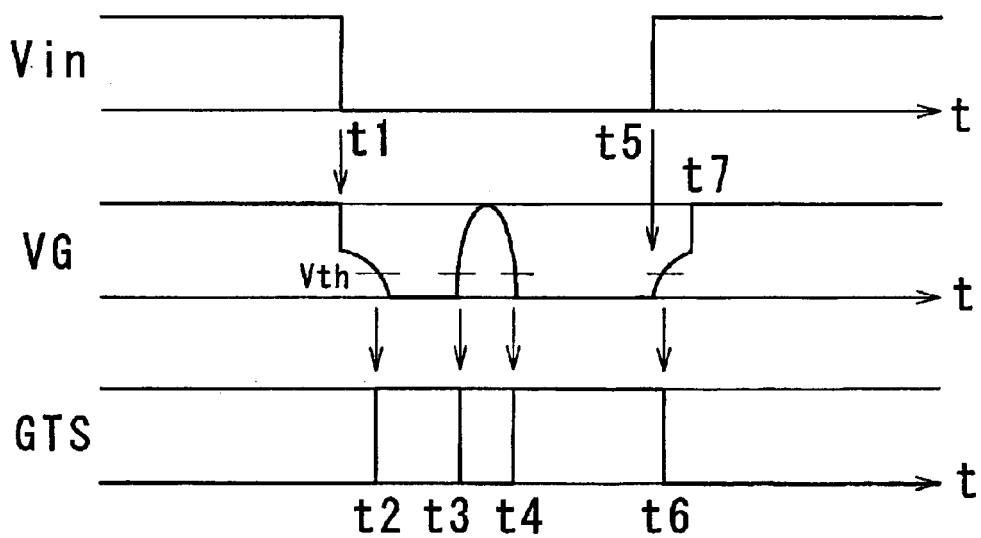
FIG. 4B is a timing diagram showing the operation.

FIG. 2A is a circuit diagram showing another embodiment of the present invention, and FIG. 2B is a timing diagram showing the operation thereof. A gate driver circuit B1 includes a source-side transistor Q1 such as p-type MOSFET and a sink-side transistor Q2 such as n-type MOSFET, which are complementarily connected in series to drive the gate of a switching device Q3. An inverter G1 inverts an input signal supplied to an input terminal Tin to supply the inverted signal to the gate driver circuit B1.

The operation of the gate driver circuit B1 will be described below. When input voltage Vin is at high level, the transistor Q1 of the gate driver circuit B1 turns on while the transistor Q2 turns off, so that the gate voltage VG of the switching device Q3 becomes high level, as a result, a switching device Q3 turns on.

Next, when the input voltage Vin becomes low level, the transistor Q1 turns off while the transistor Q2 turns on, so that the gate voltage VG becomes low level, as a result the switching device Q3 turns off.

Thus the switching device Q3 can make conduction or cut off alternatively in response to the input signal level.

A gate sink (GTS) circuit B2 includes a filter circuit B3, a comparator CMP and a sink switching device Qs such as n-type MOSFET. The filter circuit B3 delays the input signal from the terminal Tin. The comparator CMP compares an output of the filter circuit B3 with a predetermined threshold value Vth. The sink switching device Qs is connected between the gate of the switching device Q3 and a ground line.

The gate of the sink switching device Qs is supplied with the output of the comparator CMP. The threshold voltage Vth for the comparator CMP is set by the expression, power supply voltage Vcc×(division ratio of resistors R3 and R4).

The filter circuit B3 includes a switching device Q4, a capacitor C1 and a current source CC. The switching device Q4 can make conduction or cut off alternatively in response to the input signal level. The capacitor C1 is connected in parallel with the switching device Q4. The current source CC supplies a current to the capacitor C1.

The operation of the gate sink circuit B2 will be described below. Referring to FIG. 2B, when the input voltage Vin is at high level, the switching device Q4 in the filter circuit B3 turns on, so that the potential of the capacitor C1 falls down nearly to the ground voltage and thereafter becomes lower than the threshold voltage Vth. At this time, the output of the comparator CMP becomes low level and the sink switching device Qs turns off.

Next, at the time t1, when the input voltage Vin changes from high level to low level, the switching device Q4 turns off and charging current flows from the current source CC into the capacitor C1, so that the potential of the capacitor C1 gradually rises up. The rise-up in voltage is approximately linear in respect to time, and the gradient thereof is determined by the current value of the current source CC and the capacitance of the capacitor C1.

At the time t2, when the potential of the capacitor C1 exceeds the threshold voltage Vth, the output of the comparator CMP changes to high level and the sink switching device Qs turns on. Whereupon, the gate of the switching device Q3 makes conduction with the ground line and the gate voltage VG can be stabilized at the ground voltage.

Accordingly, controlling a charging time constant for the capacitor C1 allows the delay time from the time t1 to t2 to be set to a desired value. For example, the charging time constant is preferably set so as to prevent the influence due to charging current flowing into the capacitance between the gate and collector of the switching device Q3.

Next, at the time t3 to t4, when the gate voltage of a source-side switching device (not shown) coupled with the switching device Q3 increases, which influences the gate voltage VG to increase (see broken line shown in FIG. 2B). In this embodiment, since the on-state of the sink switching device Qs continues, so that the gate voltage VG can be stabilized at the ground voltage.

At the time t5, when the input voltage Vin changes from low level to high level, the switching device Q4 turns on and the potential of the capacitor C1 gradually falls down. The fall-down curve in voltage is determined by a discharge time constant for the capacitor C1, which is generally determined by the internal impedance of the switching device Q4 and the capacitance of the capacitor C1.

At the time t6, when the potential of the capacitor C1 becomes lower than the threshold voltage Vth, the output of the comparator CMP changes to low level, and the sink switching device Qs turns off. Thus, the gate of the switching device Qs is cut off from the ground line.

At the time t7, the gate voltage VG changes to high level by the gate driver circuit B1, so that the switching device Q3 can turn on.

Accordingly, controlling the discharge time constant for the capacitor C1 allows the delay time from the time t6 to t7 to be set to a desired value. For example, in case the discharge time constant is set relatively small, which can shorten the period when both the transistor Q1 in the gate driver circuit B1 and the sink switching device Qs in the gate sink circuit B2 simultaneously turn on. As a result, flow-through current can be reduced, resulting in improvement of power efficiency.

Furthermore, the gate sink circuit B2 is preferably provided with the filter circuit B3 described above, in which the charging and discharge time constants for the capacitor C1 can be set independently of each other. Therefore, the optimal delay times for phenomena when the switching device Q3 turns on and off can be separately set by adjusting these time constants different from each other.

In this embodiment, the gate voltage VG of the switching device Q3 is not monitored, thereby preventing malfunction of the gate sink circuit B2 due to the charging current flowing into the capacitance between the gate and collector of the switching device Q3.

In this embodiment, the capacitor charge and discharge circuit is used for the filter circuit. Alternately, other analog and digital circuits may be used.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A driver circuit for semiconductor switching device, comprising:

a gate drive circuit for driving the gate of a semiconductor switching device in response to an input signal;

a comparator circuit for comparing a gate voltage of the semiconductor switching device with a predetermined threshold valve;

a memory circuit configured to be set in response to inversion of an output of the comparator circuit and reset in response to of the input signal; and a gate sink device for stabilizing the gate voltage of the semiconductor switching device when the memory circuit is set.

2. The driver circuit according to claim 1, further comprising:

a logical product circuit configured to output the logical product of the inversion of input and the inversion of output of the comparator circuit as a set signal for the memory circuit.

* * * * *